US008358538B2

United States Patent
Moschiano et al.

(10) Patent No.: US 8,358,538 B2
(45) Date of Patent: Jan. 22, 2013

(54) ERASE CYCLE COUNTER USAGE IN A MEMORY DEVICE

(75) Inventors: Violante Moschiano, Bacoli (IT); Giovanni Santin, Vazia (IT); Luca De Santis, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/268,158

(22) Filed: Oct. 7, 2011

(65) Prior Publication Data

US 2012/0026792 A1 Feb. 2, 2012

Related U.S. Application Data

(63) Continuation of application No. 12/410,696, filed on Mar. 25, 2009, now Pat. No. 8,036,035.

(51) Int. Cl.
*G11C 16/10* (2006.01)
*G11C 16/04* (2006.01)

(52) U.S. Cl. .............................. 365/185.03; 365/185.11
(58) Field of Classification Search .................... None
See application file for complete search history.

(56) References Cited

U.S. PATENT DOCUMENTS

2007/0245068 A1* 10/2007 Yero ............................ 711/103
2008/0266970 A1* 10/2008 Lee et al. ................. 365/185.19
2009/0052269 A1   2/2009 Moschiano et al.

* cited by examiner

*Primary Examiner* — Hoai V Ho
*Assistant Examiner* — James G Norman
(74) *Attorney, Agent, or Firm* — Leffert Jay & Polglaze, P.A.

(57) ABSTRACT

Memory devices to facilitate adjustment of program voltages applied during a program operation based upon erase operation cycle counter values stored in the memory device. In one such embodiment, an erase cycle counter is maintained for each block of a memory device and is stored in the associated block of memory. Programming voltage levels utilized during program operations of memory cells are determined, at least in part, based upon the value of the erase cycle counter stored in a memory block undergoing a programming operation, for example.

25 Claims, 6 Drawing Sheets

ERASE CYCLE COUNTER USAGE IN A MEMORY DEVICE

RELATED APPLICATION

This Application is a Continuation of U.S. application Ser. No. 12/410,69, titled "ERASE CYCLE COUNTER USAGE IN A MEMORY DEVICE" filed Mar. 25, 2009 now U.S. Pat. No. 8,036,035, (allowed) which is commonly assigned and incorporated herein by reference.

TECHNICAL FIELD

The present disclosure relates generally to memory devices and in particular the present disclosure relates to methods and apparatus for programming memory devices utilizing an erase cycle counter.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data values for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory devices typically use a one-transistor memory cell that allows for high memory densities, high reliability, and low power consumption. Storing data in a flash memory cell can be accomplished by changing the threshold voltage (Vt) of the cell, through programming (e.g., "writing") a charge storage node, such as a charge storage layer or a floating gate or trapping layers or other physical phenomena, for example. By defining two or more ranges of threshold voltages to correspond to individual data values, one or more bits of information may be stored on each cell. Memory cells storing one bit of data by utilizing two threshold voltage ranges are typically referred to as Single Level Cell (SLC) memory cells. Memory cells storing more than one bit of data per cell by utilizing more than two possible threshold voltage ranges are typically referred to as Multilevel Cell (MLC) memory cells.

Flash memory typically utilizes one of two basic architectures known as NOR flash and NAND flash wherein the designation is derived from the logic used to read the devices. In NOR flash architecture, a column of memory cells are coupled in parallel with each memory cell coupled to a data line, often referred to as a bit line. In NAND flash architecture, a column (e.g., NAND string) of memory cells are coupled in series with only the first memory cell of each column coupled to a bit line.

Typically in both NOR and NAND configurations, memory cells are logically arranged into arrays of rows and columns. The control gates of memory cells of a given row are coupled by a common access line, which is often referred to as a word line. Programming of flash memory cells is accomplished by applying a programming voltage to selected word lines of the memory array in order to shift the threshold voltages of memory cells selected for programming. Because the memory cells of a given row are coupled to a common word line, each memory cell is therefore subjected to the programming voltage applied to the word line. During a typical programming operation, an initial programming voltage is applied to memory cells which are to undergo a programming operation. Following the initial programming attempt, a verify operation is performed in order to determine if the memory cells have reached their intended programmed levels. If so, the programming operation is complete. If one or more cells have not achieved their intended programmed levels then additional programming operations utilizing increasing programming voltages are repeated, each followed by verify operations, until the memory cells have all reached their intended programmed levels. This process is repeated during each programming operation performed on the memory device.

As memory devices age (e.g., through repeated program/erase cycles) the memory cells can change operating characteristics, such as how they respond to programming and/or erase operations performed on them. Typical programming/erase processes can result in programming operations performed at levels which are unlikely to result in, or substantially contribute to, a successful programming operation. Thus, programming efficiency can be reduced due to the application of programming pulses which are unlikely to significantly affect the programming of selected memory cells during a programming operation. In addition, performing programming operations on memory cells can also affect the programming of other nearby memory cells in the memory device. This phenomenon is typically referred to by those skilled in the art as program disturb effects. Thus, it is desirable to reduce the number of programming operations performed on a memory device.

For the reasons stated above, and for other reasons that will become apparent to those skilled in the art upon reading and understanding the present specification, there is a need in the art for alternatives to existing programming schemes for flash memory devices.

DETAILED DESCRIPTION

In the following detailed description of the present embodiments, reference is made to the accompanying drawings that form a part hereof, and in which is shown by way of illustration specific embodiments in which the disclosure may be practiced. These embodiments are described in sufficient detail to enable those skilled in the art to practice the embodiments of the invention, and it is to be understood that other embodiments may be utilized and that electrical, mechanical or process changes may be made without departing from the present disclosure. The following detailed description is, therefore, not to be taken in a limiting sense.

Figure 1:
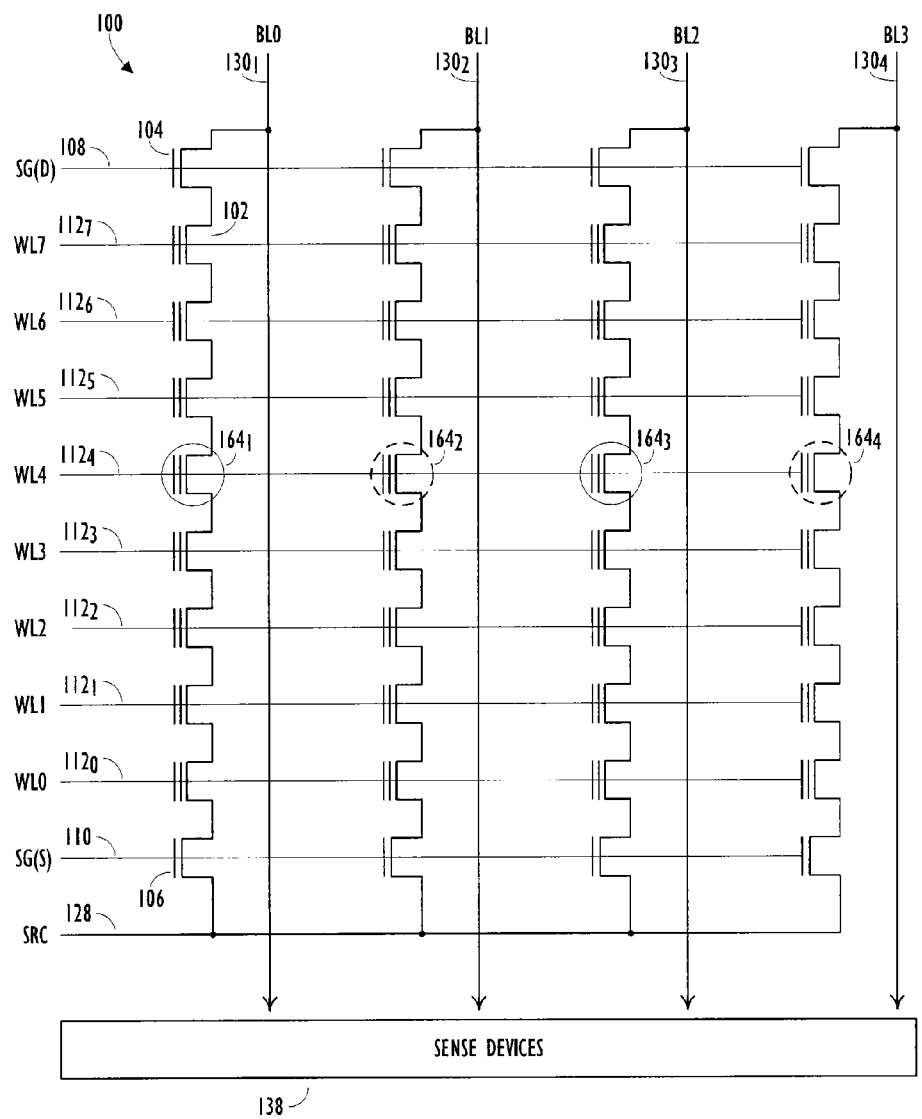
FIG. 1 is a diagram of a plurality of memory cells arranged in an array of memory cells.

Flash memory cells 102 are typically arranged in memory arrays 100 of rows (e.g. memory cells coupled to word lines) and columns coupled to bit lines 130 such as shown in FIG. 1. Memory cells 164 sharing a common word line WL4 $112_4$ experience applied programming voltage pulses at the same time, although the memory cells 164 might be programmed to different final threshold levels. NAND strings of flash memory cells are arranged in columns of multiple memory cells, each coupled drain to source as shown in FIG. 1, such as located between select gates 104 and 106, for example. A drain select gate 104 couples one end of the NAND string to an associated bit line BL0 $130_1$. A source select gate 106 couples the opposing end of the NAND string to a common source line 128. Each bit line BL0-BL3 130 is further coupled to sensing devices 138, e.g., sense amplifiers, (detail not shown.) Sense amplifiers and other sensing devices are known to those skilled in the art and are therefore not discussed further in relation to the various embodiments of the present disclosure. According to some architectures, alternate memory cells of a particular row of memory cells (e.g., coupled to odd/even bit lines) selected for programming may be verified in separate verification operations following one or more programming pulses being applied to the selected memory cells. For example, memory cells such as cells $164_2$ and $164_4$, of a selected row WL4 $112_4$ and coupled to bit lines BL1 $130_2$ and BL3 $130_4$ might be verified first following the application of a programming voltage to WL4 $112_4$. This can be followed by a verification of memory cells of the same selected row WL4 $112_4$ but which are coupled to bit lines BL0 $130_1$ and BL2 $130_3$ of the array, such as memory cells $164_1$ and $164_3$, for example. Memory arrays can comprise many more memory cells, word lines, bit lines and sense devices than those shown in FIG. 1 as is known to those skilled in the art.

MLC technology permits the storage of two or more bits per memory cell, depending on the quantity of threshold voltage ranges assigned to the memory cell and the stability of the assigned threshold voltage ranges during the lifetime operation of the memory cell. MLC memory cells may store even or odd numbers of bits on each memory cell. The number of threshold voltage ranges, which are sometimes referred to as Vt distribution windows, used to represent a bit pattern comprised of N-bits is $2^N$.

Figure 2:
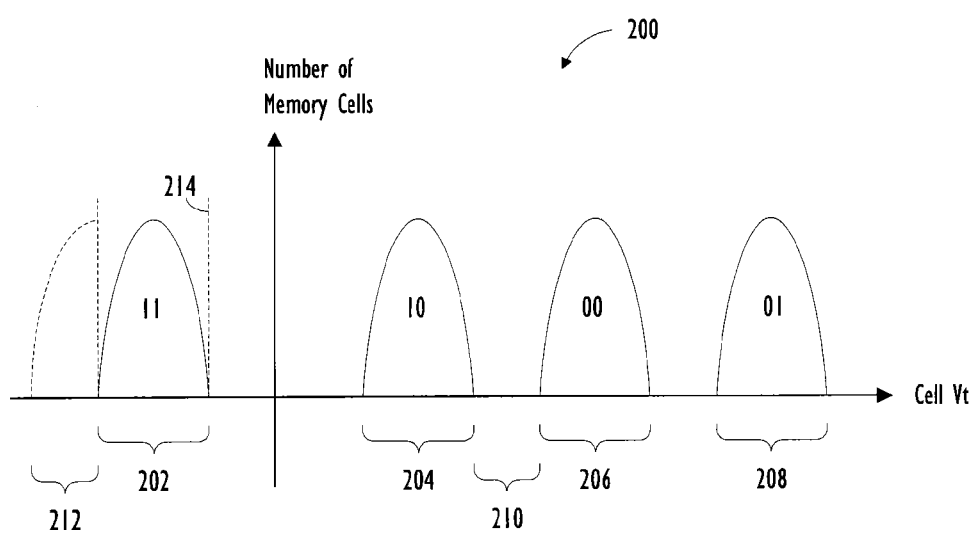
FIG. 2 is a diagram showing threshold voltage distributions levels for a population of multiple level memory cells.

FIG. 2 illustrates an example of a Vt distribution 200 for MLC memory cells capable of storing two bits. However, it should be noted that one or more embodiments of the present disclosure are not limited to storing two bits per cell. As illustrated by FIG. 2, a cell may be programmed to a Vt that falls within one of four different threshold voltage ranges 202-208 of 200 mV, each being used to represent a data state corresponding to a bit pattern comprised of two bits. Typically, a dead space 210 (which is sometimes referred to as a margin) of 200 mV to 400 mV is maintained between each range 202-208 to keep the ranges from overlapping. As one example, if the voltage stored on a memory cell is within the Vt range 202, the cell in this case is storing a logical '11' state and is typically considered the erased state of the cell. If the voltage is within the Vt range 204, the cell in this case is storing a logical '10' state. A voltage in the range 206 of the four Vt ranges would indicate that the cell in this case is storing a logical '00' state. Finally, a Vt residing in the Vt range 208 indicates that a logical '01' state is stored in the cell. The various embodiments of the present disclosure however are not limited only to four data states as represented by the threshold voltage ranges 202-208 as shown in FIG. 2, or to the example bit patterns assigned to the different threshold voltage ranges 202-208.

Flash memory cells are generally erased in blocks (e.g., 'erase blocks') wherein all the threshold voltages of the memory cells in the block are returned to a common state. This state is typically referred to as the 'erased state,' such as state 202 as shown in FIG. 2, for example. An erase operation performed on one or more blocks of memory cells selected for erasure is intended to erase all of the memory cells in the erase block and return them to an erased state. This erase operation prepares the one or more blocks of memory cells for data to be programmed in the block during one or more future programming operations. As discussed above, flash memory cells are typically programmed a row at a time as indicated by the circled memory cells 164 of FIG. 1. A row of memory cells of an array of memory cells may be further delineated into one or more pages of memory. For example, an entire row of a block of memory cells may comprise a single page of memory cells. A single row of memory cells of a particular block of memory cells may also comprise many pages of memory cells. Pages of memory cells might comprise one or more bytes of data, for example.

Memory cell programming is accomplished by providing pulses of a programming voltage, typically increasing in magnitude, to a selected word line such as $112_4$ coupled to the row of memory cells 164 to be programmed (e.g., selected memory cells.) With each programming pulse that is applied, the threshold voltages of the memory cells selected for programming are shifted by some amount. The programming process is thus dependent, at least in part, on the number and magnitude of the applied programming pulses. Following each applied programming pulse, a verify operation is performed on the selected memory cells in order to determine if additional programming pulses are needed. This process of applying a programming pulse followed by a verify operation continues until the threshold voltages for the selected memory cells have all reached their intended levels, such as 202-208 shown in FIG. 2, for example. If after a particular number of programming attempts have been made and one or more memory cells still have not passed the verify operation, those memory cells may be marked as defective and may be blocked from further use.

As memory cells reach their intended programming levels, those cells are inhibited from further programming while memory cells that have not yet reached their intended programming levels continue to be programmed. For example, if the memory cell $164_1$ of FIG. 1 is to be programmed to threshold voltage range 204 and memory cell $164_3$ is to be programmed to threshold voltage range 208, then memory cell $164_3$ will typically require more programming pulses to achieve its intended state than memory cell $164_1$. These additional programming pulses needed to complete programming of memory cell $164_3$ in this example might cause a number of issues. One issue is the additional number of pulses increases the programming time required to complete programming of the memory cells for the row of memory being programmed. Further, these programming pulses can cause undesirable shifts, often referred to as 'program disturb,' in memory cells of the selected row and potentially adjacent rows that have already achieved (e.g., have been programmed to) their intended threshold voltage level. One or more embodiments of the present disclosure provide methods and apparatus to mitigate these program disturb issues, facilitate a reduction in the number of programming pulses needed to complete programming of a given row of memory cells and facilitate a reduction in the overall time needed to program a row of memory cells as well.

Programming of memory cells, such as flash memory cells, can be accomplished through a process known as Fowler-Nordheim tunneling wherein charges originating in the channel region of the memory cell are forced through an insulating layer where they are then trapped in a charge storage layer (e.g., floating gate.) The more charges that are trapped in the charge storage layer the higher the threshold voltage for the memory cell will be. The rate of charge tunneling is dependent, at least in part, on the potential difference between the programming voltage applied to the control gate and the potential of the channel region of the memory cell. Thus, the initial and subsequent applied programming pulse voltages can affect the programming characteristics of the selected memory cells.

Typically, a memory cell programming operation performed on one or more memory cells begins with the application of a predetermined and constant initial programming voltage applied to the selected word line. The programming voltage is then incrementally increased and applied over a series of programming pulses until the one or more selected memory cells achieve their intended programming level. However, as memory cells are subjected to more and more erase (and programming) cycles, the programming characteristics of the memory cells can change. Thus, applying the predetermined initial programming voltage during a programming operation when a memory device is new may not be the most desirable initial programming voltage to be applied as the memory cells experience more and more erase cycles (e.g., 'age') during the operation of the memory device over its lifetime. Thus, one or more embodiments of the present disclosure utilize an erase cycle counter to track the number of erase operations each block of memory cells of a memory device has experienced. This tracked erase cycle count is maintained and utilized according to one or more embodiments of the present disclosure to determine the appropriate initial programming threshold potential to be applied to the memory cells of a particular block of memory cells during a programming operation based on the age of the particular erase block. The erase cycle counter value can be stored in its respective (e.g., corresponding) memory block according to one or more embodiments of the present disclosure. For example, each erase cycle counter value might be stored in one or more pages of its corresponding block of memory cells. However, one or more embodiments of the present disclosure might instead store a particular erase cycle counter in a different memory block than the memory block that the erase cycle counter value corresponds to, for example. Thus, the one or more embodiments of the present disclosure allow for tailoring (e.g., trimming) the initial programming potential utilized for each block of memory during a program operation of each individual block's memory cells.

Figure 3:
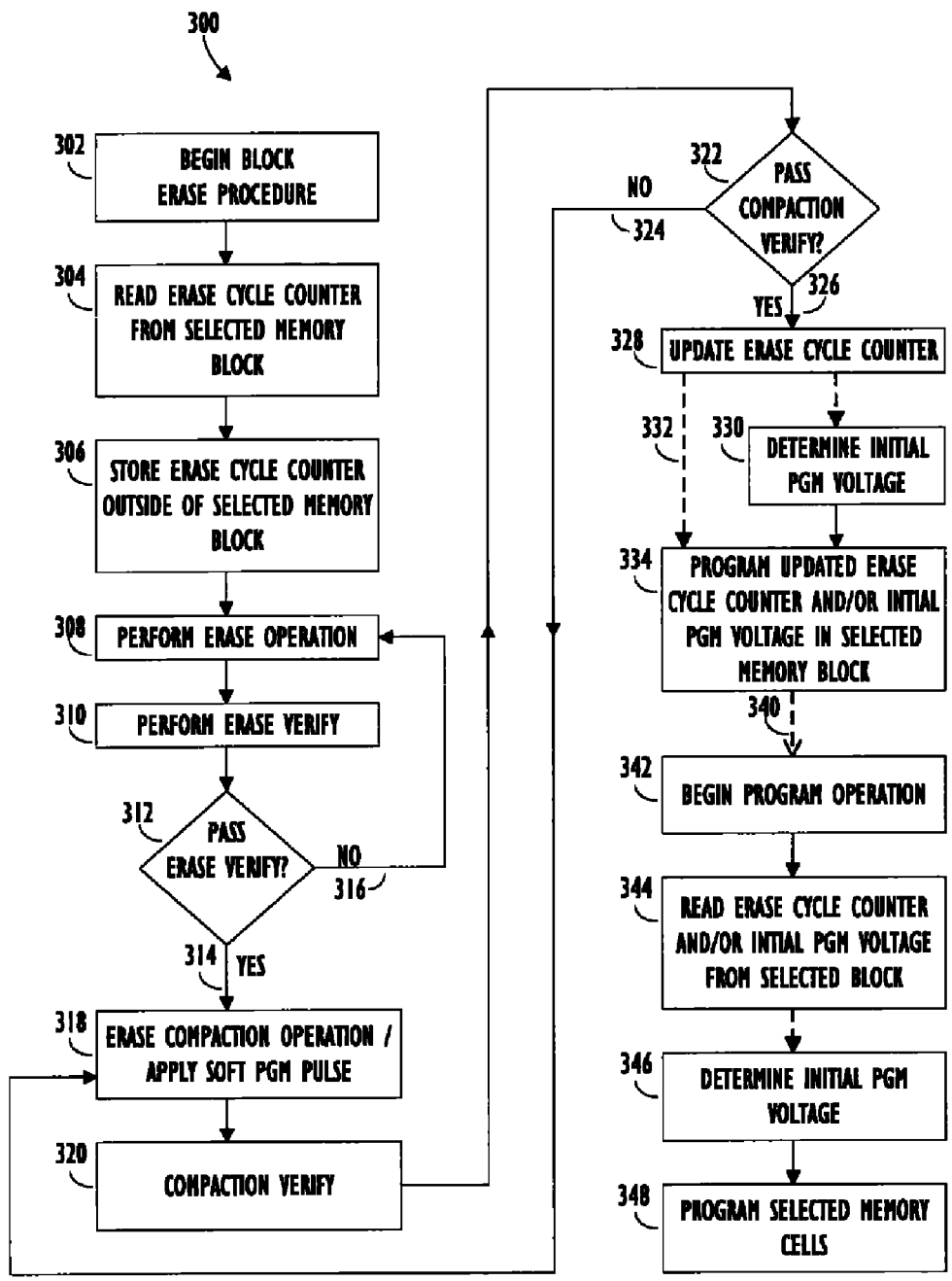
FIG. 3 is a diagram of a flowchart illustrating a method according to an embodiment of the present disclosure.

FIG. 3 shows a flowchart illustrating a method according to one or more embodiments of the present disclosure. As part of the normal operating characteristics of a flash memory device, one or more memory blocks of a memory device might be marked for erasure (not shown.) At some point in time, often determined by control circuitry within the memory device or by the direction of another control device such as a host (e.g., processor) coupled to the memory device, a block erase operation will be initiated 302 on one or more blocks of memory that have been marked for erasure. According to one or more embodiments of the present disclosure, prior to erasing a selected memory block, the erase cycle counter of the selected block is read from the selected block 304. The erase cycle counter value is read from the selected block 304 prior to erasing the block so as to not destroy the current value of the erase cycle counter stored in the selected block during the erase operation performed on the selected memory block. The erase cycle counter having been read 304 from the selected block of memory might be stored (e.g., temporarily stored) in another location of the memory device 306 which is separate from the selected block. For example, it may be stored in circuitry of the memory device such as one or more data registers, RAM memory and/or the erase cycle count value might be stored in another block of flash memory of the memory device. The erase cycle counter might be stored in non-volatile memory of the device so as to not loose the information should a reset and/or power failure of the device occur while the current erase cycle count value is not stored in (e.g., has been erased from) the selected memory block. Thus, the erase cycle counter might be temporarily stored in both RAM memory and non-volatile memory, thus serving as a back up to the cycle counter value residing in the volatile RAM memory according to various embodiments of the present disclosure.

A pre-program operation might be performed (not shown) in order to program all of the memory cells of the block to a fully programmed state after reading the erase cycle counter from the selected block 304 and prior to performing an erase operation 308 on the memory cells. As a result, the threshold voltage of all of the memory cells of the selected block need to be shifted substantially the same amount during the performance of the erase operation, such as to prevent and/or minimize the number of over erased cells, for example. Over-erasure of memory cells is discussed below. Following a read operation 304 and storage 306 of the erase cycle counter from the selected memory block, an erase pulse is applied to the selected block of memory in order to erase the memory cells within the selected block 308. An erase verify operation 310 is then performed following the application of the erase pulse 308 to determine if the threshold voltages of all of the memory cells in the selected memory block have been sufficiently affected (e.g., shifted.) A determination is made 312 if the selected block has passed 314 the erase verify operation 310. For example, the erase verify 310 determines if the threshold voltages of all the memory cells to be erased have been shifted to the left of line 214 of FIG. 2. If the erase operation was not successful 316 in sufficiently shifting the threshold voltages of all the memory cells of the selected block, then an additional erase operation is performed 308. This erase operation 308, erase verify operation 310 and erase verify successful determination 312 sequence of operations is repeated until the erase verify operation indicates that all of the threshold voltages of memory cells of the selected memory block have been sufficiently shifted 314. According to one or more embodiments of the present disclosure, if a particular number (e.g., maximum) number of erase operations 308 have been performed and the selected memory block still fails the erase verify operation 316, the selected block may be marked as defective (not shown) and be blocked from future use by the memory device.

Following the successful completion of the erase verify operation 314, a compaction operation, which is sometimes referred to as a soft program operation 318, can be performed. During the previous erase operation 308, it is possible that the threshold voltage one or more memory cells of the selected block has shifted more than that which is desired as part of the erase operation 308. This is often referred to as memory cells that have been 'over erased' by the erase operation 308. Memory cells which have been over erased during an erase operation 308 might have threshold voltage values residing in the area outlined by the dashed lines 212 of FIG. 2, for example. Thus, a compaction operation 318 can be performed to shift the threshold voltages of these over erased cells 212 into the intended erased state represented by threshold voltage range 202 such as shown in FIG. 2, for example. Where no memory cells have been over erased during an erase operation 308, the compaction operation 318 might be skipped according to one or more embodiments of the present disclosure.

The compaction operation 318 can include applying one or more soft program pulses to the over erased memory cells. Memory cells which reside in the intended threshold voltage range 202 might be inhibited to help prevent these memory cells from shifting their threshold voltages as a result of the applied soft program pulses during the compaction operation 318. Following the application of a soft program pulse 318, a compaction verify operation 320 is performed to determine the effectiveness of the applied soft program pulse in shifting the over erased memory cells 212 into the threshold voltage range 202. If the verify operation 320 failed 324, another application of a soft programming pulse is applied 318 followed again by another compaction verify operation 320. This process is repeated until the compaction verify operation indicates a pass condition 326 has been achieved. As discussed above with respect to the erase operation 308, a particular number of performed compaction operations (e.g., application of soft program pulses 318 followed by compaction verify operations 320) with no indication of a compaction pass condition 326 might indicate that a failure has occurred in the selected block and the block may be marked (not shown) as unavailable for future use by the memory device.

Following the successful compaction verify operation 326 on the selected block of memory, the erase cycle counter, which was previously read from the selected block 304 and temporarily stored in some location other than the memory block to be erased 306, is updated (e.g., incremented) 328 in response to the erase operation 308 performed on the selected block of memory. For example, the erase cycle counter may be incremented by one upon the successful erasure of the memory block regardless of the number of applied erase pulses 308 that were applied for the particular erase operation to be completed, for example. The erase cycle counter might also be updated 328 by as many erase pulses 308 that were applied in order to pass the erase verify operation 314. For example, as discussed above, one or more erase operations 308/310/312 may be repeated one or more times until the selected block passes the erase verify operation 314. Thus, according to one or more embodiments of the present disclosure, the erase cycle counter may be updated 328 with the total number of erase pulses 308 that were actually applied to the selected memory block during the current erase operation.

Because storing the updated erase cycle counter 328 in its respective block of memory is performed by performing a programming operation 334, one or more embodiments of the present disclosure may utilize the erase cycle count value to determine the initial programming voltage 330 in the programming of the updated cycle counter into the block of memory 334. Additional embodiments might not utilize the determined initial programming voltage 330 to program the updated erase cycle counter into its block of memory and may instead utilize the erase cycle counter value only to program user data (e.g., such as data not comprising erase cycle counter data) to be stored in the block of memory. Thus, the path from 328 may be through 330 or 332 as indicated by dashed lines according to various embodiments of the present disclosure, for example.

According to one or more embodiments of the present disclosure, the updated erase cycle counter value 328 is programmed in its corresponding block of memory 334 following 332 the update operation 328. The updated erase cycle counter value may be stored in one or more particular pages of the selected block of memory. The erase cycle counter value might be stored in four particular bytes of a particular page of the block of memory, for example. Additional embodiments according to the present disclosure might store the updated erase cycle count value as a number of completed erase cycles the block of memory has been exposed to as opposed to an actual numerical count of erase pulses which might have been applied in order to successfully erase a particular block of memory cells. Still further embodiments might store the updated cycle count value and/or a value representative of a determined initial programming voltage 330 to be applied during a programming operation of the block of memory. For example, the initial programming voltage might be determined and its value stored 334 in a particular page of the corresponding block of memory. This determined initial programming voltage value may be stored 334 along with the updated erase cycle count value. Thus, during a subsequent programming operation, such as discussed below, the initial programming voltage might be directly read from the block of memory and utilized during programming operations performed on that block of memory. This method, according to various embodiments of the present disclosure, allows the device to immediately set and apply the initial programming voltage to be used without having to determine (e.g., calculate) the initial programming voltage from the stored erase cycle count value each time a programming operation is to be performed, thus improving the efficiency of the programming operation.

For example, prior to an erase operation 308 the current cycle counter value might be read from the memory block selected for erasure 304 and the current value stored in a location apart from the block to be erased 306. The erase operation is then performed on the selected memory block 308 which erases the entire block of memory, including the stored erase cycle counter value and any previously determined initial programming voltage values stored in the selected memory block. Following the completion of the erase operation 314 and, if performed, compaction operation 326, the erase cycle counter is updated 328 and a new initial programming voltage is determined 330. Both the updated erase cycle counter and the new initial programming voltage values are then stored in the selected block of memory 334. Thus, according to one or more embodiments, the erase cycle counter value is utilized only during the temporary storage 306 of the value prior to the erase operation and the determination of a new initial programming voltage 330 after the erase cycle counter in temporary storage is updated 328 following the erase operation. Thus, until a new block erase operation is initiated on the block of memory, only the determined initial programming voltage value is read from the block and utilized during programming of data (e.g., user data) in the block. It should be noted, that still further embodiments might also read and temporarily store the old initial programming voltage along with the old erase cycle counter value read from the block of memory prior to erasure of the block.

FIG. 3 further illustrates the initiation of a program operation 342 which might occur at some time (e.g., as indicated by the dashed arrow 340) following the update of the erase cycle counter, such as with respect to step 328 and/or 334 discussed above, for example. A program operation according to one or more embodiments of the present disclosure might include the indication 342 that data (e.g., user data) is to be stored in a particular block of memory that has been selected for programming. Prior to programming the data in the selected memory block, the erase cycle counter currently stored in the selected block of memory is read 344. An initial programming voltage to be used in programming the data in the selected block is then determined 346 in response, at least in part, to the erase cycle counter value that was read 344 from the selected memory block.

Various methods may be utilized in determining the initial programming voltage 346/330 in response to the erase cycle counter value stored in the selected memory block 344/328. For example, circuitry of the memory device might be configured to utilize the updated erase cycle counter value in order to determine an initial programming voltage level to be utilized. For example, the initial programming voltage may be determined as a linear or a non-linear function of the erase cycle counter value. Alternatively, the initial programming voltage may be determined using a look-up table or the like. For example, if the memory device is configured to provide a number of different initial programming voltages, each possible initial programming voltage might be assigned to a range of erase cycle counter values such that a first initial programming voltage is selected while the erase cycle counter is less than a first value, a second initial programming voltage is selected if the erase cycle counter is greater than or equal to the first value but less than a second value, and so on. Once the initial programming voltage has been determined 346/330, a programming operation can be performed 348/334 to program the data into the selected memory array utilizing the determined initial programming voltage 346/330.

A memory device configured in accordance with one or more embodiments of the present disclosure might also determine the initial programming voltage prior to storing the updated erase cycle counter in the selected memory block, such as illustrated by step 330 of FIG. 3, for example. Thus, according to one or more embodiments, the determined initial programming voltage 330 might be stored along with the updated erase cycle counter value 328 in the selected memory block 334. Thus, by determining and storing the determined initial programming voltage in the selected memory block, step 346 might be eliminated because the initial programming voltage has already been determined. Therefore, during a programming operation initiated 342 in accordance with one or more embodiments of the present disclosure, the initial programming voltage determined 330 and stored in the selected memory block 334, can be read 344 and utilized 348 without the delay of having to determine the initial programming voltage 346 for every program operation to be performed on the selected memory block. As multiple programming operations might be performed on memory cells of a particular block of memory between erase operations performed on the block, a savings of resources can be realized in not needing to determine the initial programming voltage for each programming operation to be performed on the block of memory.

Figure 4:
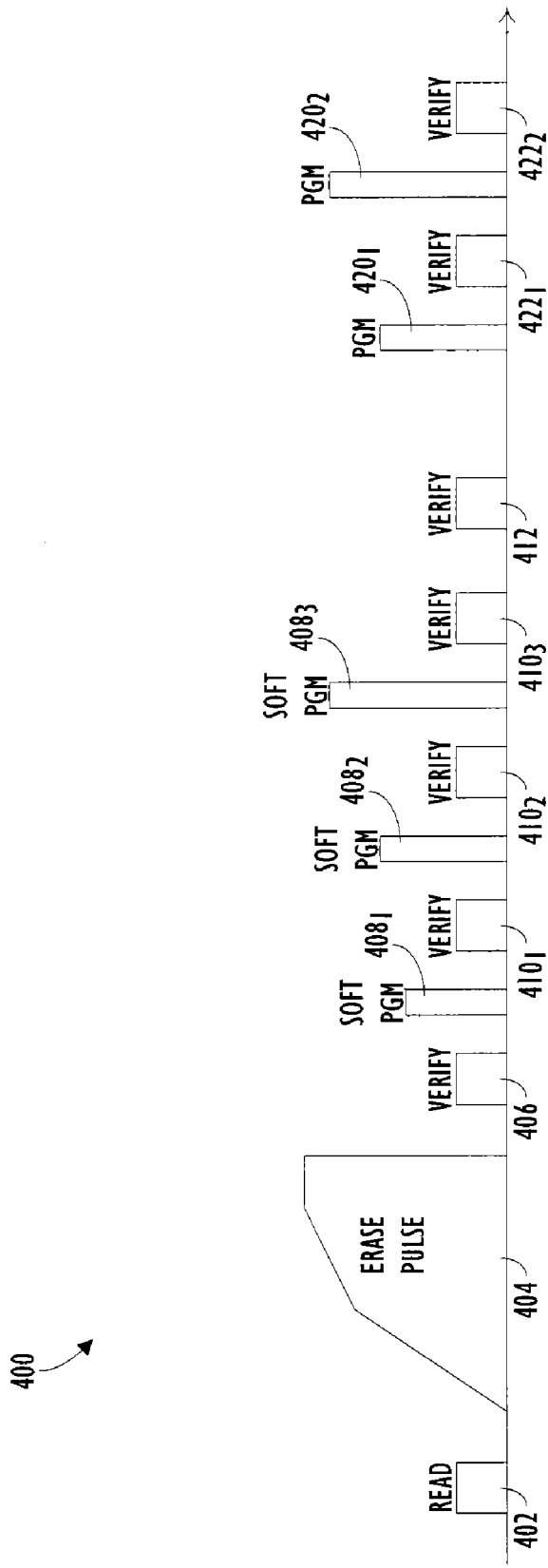
FIG. 4 illustrates a diagram of waveforms applied to a memory array according to an embodiment of the disclosure.

FIG. 4 illustrates a plot of operational waveforms 400 applied during a memory block erase operation along with an update of the erase cycle counter according to one or more embodiments of the present disclosure. It should be noted that the plot shown in FIG. 4 is intended to be illustrative of the various steps performed in accordance with various embodiments of the present disclosure, such as discussed with respect to FIG. 3, for example. Thus, FIG. 4 is not intended to necessarily limit or define particular voltages (e.g., polarity and/or magnitude) applied during memory device operations according to various embodiments of the present disclosure.

Upon initiation of an erase operation to be performed on a selected memory block 302, the current erase cycle counter stored in the selected memory block is read 402/304 from the selected block and is stored in another location of the memory device (not shown), such as discussed above with respect to step 306 of FIG. 3, for example. An erase pulse 404 is applied to the selected memory block in order to attempt to shift the threshold voltages of the memory cells of the selected memory block to an erased state, such as threshold voltage range 202 as shown in FIG. 2, for example. Following the application of the erase pulse 404, a verify operation is performed 406 in order to determine the effectiveness of the applied erase pulse 404 in shifting the threshold voltages of the memory cells to an erased state (e.g., area to the left of line 214.) If the verification 406 fails, additional erase pulses 404 can be applied followed by another verify operation 406 until the verification operation 406 passes. In the event that one or more memory cells of the block are over erased (e.g., residing in range 212), one or more soft program pulses 408 can be applied to the individual over erased cells in order to perform a compaction operation of the erased memory cells. Memory cells which are not over erased but share the same word line as the one or more over erased memory cells are inhibited (not shown) during the soft program operation 408. Following each soft program pulse operation 408, a verify operation 410 is performed to determine if and when the compaction operation of the erased (e.g., over erased) memory cells has been successful. Following the final verification in the compaction operation $410_3$, a final erase verify operation 412 might be performed in order to ensure that the memory cells of the selected block are properly erased.

Following verify operation 412, the erase cycle counter that was read previously 402/304 and stored in another area of the memory device 306 is updated 328 in response to the successful completion of the erase operation performed 412. According to one or more embodiments of the present disclosure, the erase cycle counter is incremented by a fixed value (e.g., one) regardless of the number of erase pulses 404 that might have been applied during the erase operation 400. Further embodiments, might update the erase cycle counter by the total number of erase pulses 404 applied during the current erase operation. For example, if more than one erase pulse 404 was applied due to a failure to pass the erase verify operation 406, the erase cycle counter might be incremented by the total number of erase pulses 404 actually applied. Thus, the erase cycle counter might be updated by a value of one or more following a completed erase operation 412 according to various embodiments of the present disclosure.

Following the update of the erase cycle counter as a result of passing the verify operation 412, the updated erase cycle counter and/or a determined initial programming voltage determined from the updated erase cycle counter, are stored in the corresponding block of memory utilizing a program operation 420, 422. The initial program pulse applied in order to store the updated erase cycle counter value $420_1$ might utilize the determined initial programming voltage level according to one or more embodiments of the present disclosure. Additional embodiments might utilize a predetermined initial programming voltage $420_1$ during the storage of the erase cycle counter value in the block of memory, for example. Each program pulse 420 applied during the erase cycle counter programming operation is followed by a verify operation 422 in order to determine if and when the erase cycle counter value has been successfully stored in the memory block.

Memory devices utilizing MLC memory cells in one or more blocks of memory might store the erase cycle counter in an SLC data format in the MLC memory cells. For example, an MLC memory device might be configured to store two bits of data per cell utilizing four threshold voltage ranges such as 202-208 shown in FIG. 2. In such a configuration, the erase cycle counter and/or determined initial programming voltage might be stored 334 in the MLC memory cells utilizing only the threshold voltage ranges 202 and 208, for example. This method can improve the reliability of the erase cycle counter data stored in the block of memory cells. Additional embodiments might also store 334 an additional version (e.g., representative copy) of the erase cycle counter in the selected memory block for redundancy purposes. For example, the actual erase cycle counter data may be stored in a first page of the block of memory and data comprising the complement of the erase cycle counter data might be stored in a second page of the memory block according to various embodiments of the present disclosure. Further embodiments might store the redundant copy of the erase cycle counter data in a different memory block of the memory device. Additional methods might be utilized to improve the reliability of the stored erase cycle counter data. For example, a checksum of the bits of data comprising the erase cycle counter may also be stored. Additional methods of storing actual data in one or more representative versions which can be utilized (e.g., compared) in order to determine the reliability of the stored data are known to those skilled in the art might be utilized according to various embodiments of the present disclosure.

With respect to reliability as discussed above, corruption of the erase cycle count data and/or determined initial programming voltage might occur for many reasons. One or more embodiments of the present disclosure provide for methods to handle this potential corruption of the erase cycle count data. For example, a power down of the device and/or a device reset might occur prior to writing an erase cycle count value (e.g., writing an updated erase cycle count value 334) to its corresponding block of the memory device. Thus, one or more erase cycle counter values may be corrupted and be deemed unreliable when accessed by the memory device at a later time, such as during a read operation 304 discussed above with respect to FIG. 3, for example. This might occur if an event such as a power down and/or reset of the device occurs between the erasure of the selected memory block 308 and programming of the updated erase cycle counter data 334. Thus, according to one or more embodiments of the present disclosure and illustrated by way of reference to FIG. 5, the memory device might perform a verification and/or estimation of the erase cycle counter value following the read operation 304 and prior to performing an erase operation 308 on a particular block of the memory device.

One or more embodiments of the present disclosure perform an erase cycle counter value verification (e.g., error detection) operation 500 to determine if a particular erase cycle count value is valid and might therefore be relied upon by the memory device. One method utilized by one or more embodiments of the present disclosure, programs a redundant representative copy of the erase cycle counter value each time it is updated, such as discussed above. For example, the actual erase cycle count value (e.g., primary copy) might be written to a first particular location in a block of memory 334 and a redundant copy (e.g., exact and/or representative copy) of the erase cycle counter value might be written to a second particular location in the same memory block, such as during operation 334, for example. A redundant copy might also be stored in a memory block which is different than the selected memory block. Thus, if the power down and/or reset scenario between the erase operation 308 and programming of the updated erase cycle counted data 334 occurs, then the redundant copy would still exist in the different block of memory. The memory device would preferably be configured to not allow two memory blocks storing the primary and redundant copies of the same erase cycle counter data to undergo an erase operation at the same time under this method according to the one or more embodiments of the present disclosure. The redundant copy of the erase cycle counter value might comprise an exact copy of the erase cycle counter value or may be transformed in various ways. For example, the redundant copy might comprise the complement of the primary copy of the erase cycle counter data value, for example.

In addition to storing a copy (e.g., exact and/or representative) of the erase cycle counter, additional embodiments of the present disclosure might utilize other methods to verify the erase cycle counter value. For example, in addition to storing the erase cycle counter value, error code correction (ECC) information (e.g., checksum) might also be stored along with the erase cycle counter value and be utilized to determine the reliability of the erase cycle counter value.

Figure 5:
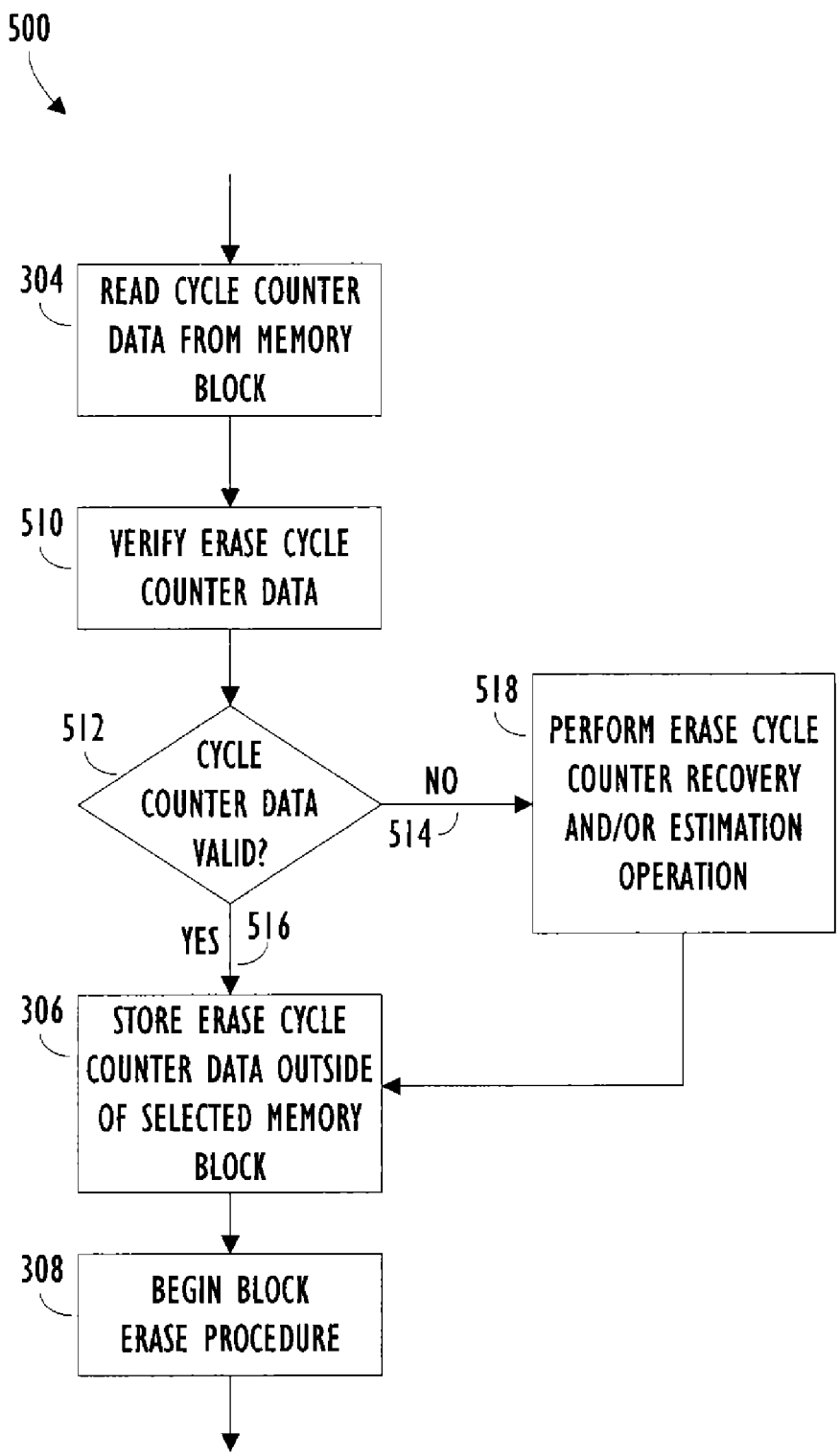
FIG. 5 is a diagram of a flowchart illustrating a method according to an embodiment of the present disclosure.

FIG. 5 illustrates a flow chart 500 representative of methods utilized to verify the legitimacy of an erase cycle counter value read from a particular block of memory prior to performing an erase operation on the memory block, for example. For example, the current erase cycle counter (and/or previously determined initial programming voltage) along with a redundant copy of the data might be read from the memory block during the read operation 304, for example. Following the read operation, a verify operation 510 is performed to verify the validity of the data read from the memory block 304. The verify operation according to one or more embodiments of the present disclosure compares the primary copy and the redundant copy to test for a match. If the two copies (e.g., primary and redundant) match, the data is considered valid 516 and the erase cycle counter value is stored in one or more locations of the memory device such as discussed above with respect to step 306 of FIG. 3. An erase operation 308 is then performed on the memory block 308. Steps 510 through 518 shown in FIG. 5, might be performed between steps 304 and 306 as discussed above. However, various embodiments of the present disclosure are not limited to performing steps 510 through 518 as a whole, or in part, exclusively between steps 304 and 306

During the verify erase cycle counter data operation 510, it may be determined that the erase cycle counter data read 304 from the selected block of memory has been corrupted in some way. For example, the redundant copy and the primary copy of the data may not match, taking into consideration that some translation of the data (e.g., interpreting the complement) might be required to determine validity. For example, if the redundant copy of the data comprises the complement of the primary copy, some translations will be performed to be able to determine if the data matches or not. The verify erase counter data operation 510 might also comprise evaluating ECC data associated with and/or part of the erase cycle counter data if such error correction code information was stored along with the erase cycle counter data, for example. Other methods might also be utilized (e.g., verifying checksums) in order to determine validity of the erase cycle counter data according to one or more embodiments of the present disclosure. Should the erase cycle counter data be determined to be invalid 514, various methods are utilized according to one or more embodiments of the present disclosure to address the invalidity of the erase cycle counter data. Various embodiments of the present disclosure might perform erase cycle counter value estimation operations that are performed in order to estimate an erase cycle count value when a previous value is unavailable or has been deemed unreliable 514. Thus, the erase cycle counter value estimation operation 518 provides for the generation of an erase cycle count value which is intended to be a reasonable approximation of what the erase cycle counter value would have been had it not been deemed unreliable 514, for example.

According to one or more embodiments of the present disclosure an estimated erase cycle count value might be generated 518 which is based, at least in part on, reading other erase cycle count values of different memory blocks in the memory device that are deemed to be reliable. For example, if the erase cycle counter data of a particular memory block is deemed to be unreliable 514, the erase cycle counter data from a representative number, e.g., ten, memory blocks, not inclusive of the particular memory block, can be read and their erase cycle counter data is verified. If the ten sets of erase cycle counter data are verified, then an estimated erase cycle counter value can be estimated 518 from the verified cycle counter values. For example, the estimated erase cycle counter data might be assigned to equal the greatest erase cycle counter value of the ten validated erase cycle counter values. Other embodiments might make some determination based on one or more statistical calculations performed on the ten validated erase cycle counter values. For example, the average value of the ten valid erase cycle counter values might be determined and assigned as the estimated erase cycle counter value to replace the value determined to be invalid during step 512, for example. Other statistical calculations might also be utilized as are known to those skilled in the art. Still further embodiments might instead assign a predetermined value (e.g., 10,000) to be the estimated erase cycle counter value 518 to be stored, such as in step 306, for example.

Still further embodiments of the present disclosure estimate the number of erase operations performed (e.g., age) on a particular block of memory based on, at least in part, the number of program pulses required for one or more memory cells of the memory block to pass a verify operation. For example, the number of soft program pulses 408, such as described with respect to FIG. 4 above, required to pass a verify operation 410 can be utilized to estimate the age and thus generate an approximate erase cycle counter value 518 for the particular block of memory, such as when an erase cycle counter value has been deemed to be invalid 514, for example. Typically, as flash memory cells are exposed to more and more erase operations (e.g., age), the programming profile of the memory cells begins to change. For example, a new memory cell might program after the application of 10 programming pulses (e.g., soft program pulses 408.) A memory cell that has been exposed to many erase operations (e.g., applied erase pulses) might successfully complete a programming operation with the application of only 3 to 4 programming pulses, for example. Thus, one or more embodiments of the present disclosure estimate the age of a block of memory cells 518 based on the number of programming pulses (e.g., soft programming pulses) required to successfully program one or more memory cells of a particular block of memory. An estimated erase cycle counter value can be determined 518 which is based, at least in part, on the age determined by the one or more embodiments of the present disclosure. This estimated erase cycle counter can then be stored (e.g., 306) for use during an erase operation such as described with respect to FIG. 3 above. This age estimation based on programming pulses required to pass a verification operation determined for each block of memory can also be stored in each corresponding block of memory to be utilized as a trim value in determining an initial programming voltage to be utilized during programming operations of the particular block of memory to which the trim value corresponds.

Figure 6:
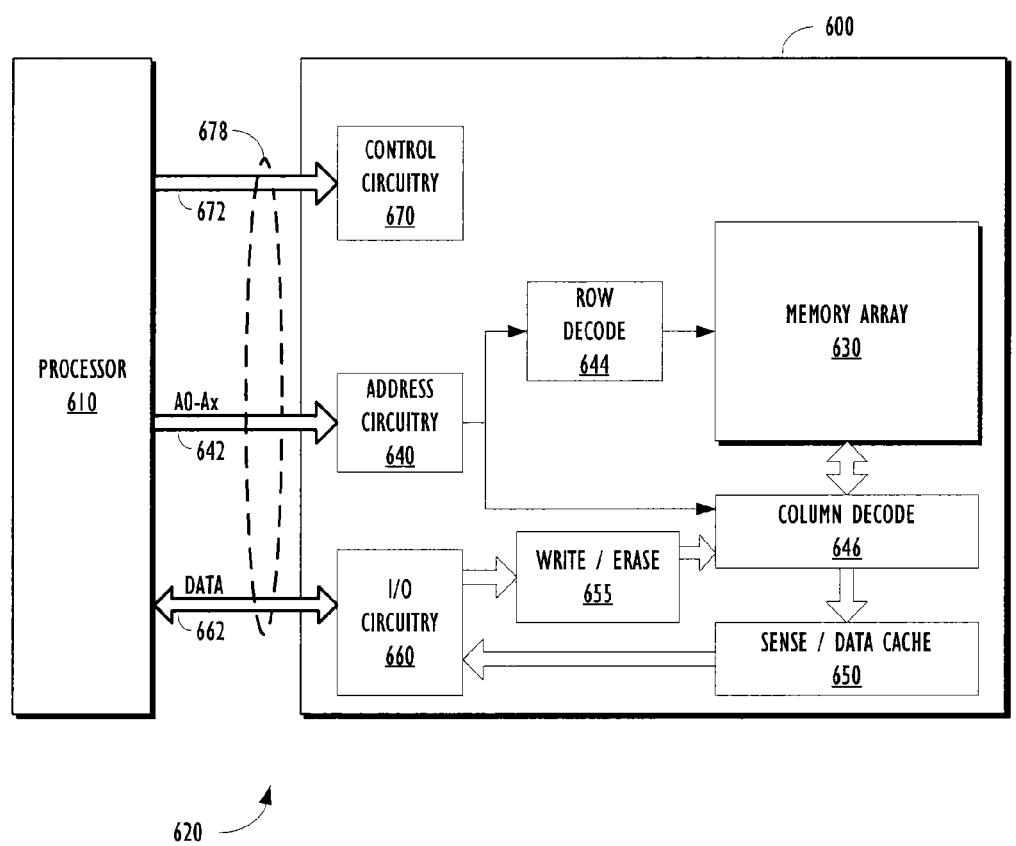
FIG. 6 is a functional block diagram of a system according to an embodiment of the present disclosure.

FIG. 6 is a functional block diagram of an electronic system 620 having at least one memory device 600 according to one or more embodiments of the present disclosure. The memory device 600 illustrated in FIG. 6 is coupled to a host such as a processor 610. The processor 610 may be a microprocessor or some other type of controlling circuitry. The memory device 600 and the processor 610 form at least part of the electronic system 620. The memory device 600 has been simplified to focus on features of the memory device that are helpful in understanding various embodiments of the present disclosure.

The memory device 600 includes one or more arrays of memory cells 630 that can be logically arranged in banks of rows and columns. Memory array 630 may comprise SLC and/or MLC memory, for example. According to one or more embodiments, the memory cells of memory array 630 are flash memory cells. The memory array 630 can contain multiple banks and blocks of memory cells residing on a single or multiple die as part of the memory device 600. The memory cells of the memory array 630 may also be adaptable to store varying densities (e.g., MLC(four level) and MLC(eight level)) of data in each cell, for example.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections 642 depends on the density and architecture of the memory array 630. That is, the number of address digits increases with both increased memory cell counts and increased bank and block counts.

The memory device 600 reads data in the memory array 630 by sensing voltage or current changes in the memory array columns using sense/data cache circuitry 650. The sense/data cache circuitry 650, in at least one embodiment, is coupled to read and latch a row of data from the memory array 630. Sense devices 138 such as those discussed with respect to FIG. 1 can also comprise the sense/data cache circuitry 650, for example. Data input and output buffer circuitry 660 is included for bi-directional data communication over a plurality of data connections 662 with the processor 610. Write/Erase circuitry 655 is provided to write and/or erase data in the memory array 630.

Control circuitry 670 is configured at least in part to implement various embodiments of the present disclosure, such as facilitating the methods discussed above with respect to FIGS. 3, 4 and 5, for example. In at least one embodiment, the control circuitry 670 may utilize a state machine. Control signals and commands can be sent by the processor 610 to the memory device 600 over a command bus 672. The command bus 672 may be a discrete signal or may be comprised of multiple signals, for example. These command signals 672 are used to control the operations on the memory array 630, including data read, data write (program), and erase operations. The command bus 672, address bus 642 and data bus 662 may all be combined or may be combined in part to form a number of standard interfaces 678. For example, the interface 678 between the memory device 600 and the processor 610 may be a Universal Serial Bus (USB) interface. The interface 678 may also be a standard interface used with many hard disk drives (e.g., SATA, PATA) as are known to those skilled in the art.

The electronic system illustrated in FIG. 6 has been simplified to facilitate a basic understanding of the features of the memory and is for purposes of illustration only. A more detailed understanding of internal circuitry and functions of non-volatile memories are known to those skilled in the art.

CONCLUSION

Memory devices and methods have been described capable of storing and utilizing erase cycle counters to provide a basis in which to determine an initial programming voltage to be applied to memory cells during a programming operation. Additional embodiments of the present disclosure provide for recovery and/or estimation of an erase cycle count value when an actual erase cycle count value is not available or has been determined to be invalid.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A memory device, comprising:
   an array of memory cells arranged in a plurality of memory blocks; and
   control circuitry, wherein the control circuitry is configured to maintain an erase cycle counter value corresponding to each memory block of the plurality of memory blocks of the memory device, store each erase cycle counter value in a memory block of the plurality of memory blocks which is different than its corresponding memory block, adjust a programming voltage in response to a particular erase cycle counter value corresponding to a particular memory block, and perform an erase cycle counter value error detection operation on each erase cycle counter value.

2. The memory device of claim 1, wherein the control circuitry is further configured to store a value corresponding to the adjusted programming voltage with the particular erase cycle counter value.

3. The memory device of claim 1, wherein the control circuitry is further configured to perform one or more program operations on one or more memory cells of the particular memory block.

4. The memory device of claim 3, wherein the control circuitry is further configured to utilize the adjusted programming voltage during each of the one or more program operations performed on the one or more memory cells of the particular memory block.

5. A memory device, comprising:
   an array of memory cells arranged in a plurality of memory blocks; and
   control circuitry, wherein the control circuitry is configured to maintain an erase cycle counter value for each memory block of the plurality of memory blocks, store each erase cycle counter value in a corresponding memory block, store a redundant erase cycle counter value for each stored erase cycle counter value, and adjust a programming voltage applied to one or more memory cells of a particular memory block in response to the erase cycle counter value corresponding to the particular memory block;
   wherein the redundant erase cycle counter values comprise complementary data to the erase cycle counter values.

6. The memory device of claim 5, wherein the control circuitry is further configured to perform an erase cycle counter value error detection operation on a particular stored erase cycle counter value to determine if the particular erase cycle counter value is an erroneous erase cycle counter value.

7. The memory device of claim 6, wherein the control circuitry is further configured to perform an erase cycle counter value error recovery operation to determine an estimated erase cycle counter value as a function of one or more erase cycle counter values stored in one or more memory blocks of the memory device other than a memory block associated with an erroneous erase cycle counter value.

8. The memory device of claim 7, wherein the control circuitry is further configured to determine the estimated erase cycle counter value to be a maximum value of the one or more erase cycle counter values stored in the one or more memory blocks of the memory device other than the erroneous erase cycle counter value.

9. The memory device of claim 7, wherein the control circuitry is further configured to determine the estimated erase cycle counter value to be an average value of the one or more erase cycle counter values stored in the one or more memory blocks of the memory device other than the erroneous erase cycle counter value.

10. The memory device of claim 7, wherein the control circuitry is further configured to assign the estimated erase cycle counter value to a particular value if an erase cycle counter value is determined to be erroneous.

11. The memory device of claim 5, wherein each redundant erase cycle counter value is stored in a memory block other than a memory block where its corresponding erase cycle counter value is stored.

12. The memory device of claim 11, wherein the control circuitry is further configured to prevent performing at the same time an erase operation on a particular erase block and an erase operation an erase block storing a redundant erase cycle counter value corresponding to the particular erase block.

13. A memory device, comprising:
   an array of memory cells arranged in a plurality of erase blocks; and
   control circuitry, wherein the control circuitry is configured to maintain an erase cycle counter value corresponding to each memory block of the plurality of erase blocks, store each erase cycle counter value in an erase block of the plurality of erase blocks which is different than its corresponding erase block, and adjust a programming voltage applied to one or more memory cells of a particular erase block in response to the erase cycle counter value corresponding to the particular erase block;
   wherein the erase cycle counter value for a particular erase block is incremented in response to the an erase operation performed on the particular erase block;
   wherein each erase block is configured to contain MLC memory cells and the control circuitry is further configured to store erase cycle counter values in the MLC memory cells of each erase block as SLC data.

14. The memory device of claim 13, wherein the erase cycle counter value corresponding to the particular erase block is incremented by a number of erase pulses applied to the particular erase block during an erase operation performed on the particular erase block.

15. The memory device of claim 13, wherein the erase cycle counter value corresponding to the particular erase block is incremented by a count of one in response to an erase operation performed on the particular erase block.

16. A memory device, comprising:
   a plurality of memory cells arranged in a plurality of erase blocks; and control circuitry, wherein the control circuitry is configured to determine an initial programming voltage to apply to memory cells of a first erase block, update an erase cycle counter value and a redundant erase cycle counter value corresponding to the first erase block in response to an erase operation performed on the first erase block, store the updated erase cycle counter value in the first erase block, store the updated redundant erase cycle counter value in a second erase block, and perform an erase cycle counter value error detection operation on the erase cycle counter value stored in the first erase block;

wherein the first erase block and the second erase blocks are different; and wherein the determined initial programming voltage is based upon the erase cycle counter value stored in the first erase block.

17. A memory device, comprising:

a plurality of memory cells arranged in a plurality of erase blocks; and control circuitry, wherein the control circuitry is configured to determine an initial programming voltage to apply to memory cells of a first erase block, update an erase cycle counter value and a redundant erase cycle counter value corresponding to the first erase block in response to an erase operation performed on the first erase block, store the updated erase cycle counter value in the first erase block, store the updated redundant erase cycle counter value in a second erase block;

wherein the first erase block and the second erase blocks are different;

wherein the determined initial programming voltage is based upon the erase cycle counter value stored in the first erase block; and wherein the redundant erase cycle counter value comprises a complimentary data value of its corresponding erase cycle counter value.

18. The memory device of claim 16, wherein the control circuitry is further configured to prevent an erase operation from being performed on the first erase block and on the second erase block at the same time.

19. A memory device, comprising:

a plurality of memory cells arranged in a plurality of erase blocks; and control circuitry, wherein the control circuitry is configured to determine an initial programming voltage to apply to memory cells of a first erase block, update an erase cycle counter value and a redundant erase cycle counter value corresponding to the first erase block in response to an erase operation performed on the first erase block, store the updated erase cycle counter value in the first erase block, store the updated redundant erase cycle counter value in a second erase block;

wherein the first erase block and the second erase blocks are different;

wherein the determined initial programming voltage is based upon the erase cycle counter value stored in the first erase block; and wherein the first erase block is configured to contain MLC memory cells and the control circuitry is further configured to store the updated erase cycle counter value in the MLC memory cells of the first erase block as SLC data.

20. The memory device of claim 16, wherein the control circuitry is further configured to determine one of a valid state and an invalid state of the erase cycle counter value stored in the first erase block.

21. The memory device of claim 20, wherein the control circuitry is further configured to generate an estimated erase cycle counter value corresponding to the first erase block in response to an invalid state determination of the erase cycle counter value.

22. The memory device of claim 16, wherein the control circuitry is further configured to perform a program operation on one or more memory cells of the first erase block where a first applied programming voltage pulse voltage for the program operation is the determined initial programming voltage.

23. The memory device of claim 16, wherein the control circuitry is further configured to store the determined initial programming voltage in the first erase block.

24. A memory device, comprising:

a plurality of memory cells arranged in a plurality of erase blocks; and control circuitry, wherein the control circuitry is configured to determine an initial programming voltage to apply to memory cells of a first erase block, update an erase cycle counter value and a redundant erase cycle counter value corresponding to the first erase block in response to an erase operation performed on the first erase block, store the updated erase cycle counter value in the first erase block, store the updated redundant erase cycle counter value in a second erase block;

wherein the first erase block and the second erase blocks are different;

wherein the determined initial programming voltage is based upon the erase cycle counter value stored in the first erase block; and wherein the control circuitry is further configured to determine the initial programming voltage by reference to a table comprising a plurality of erase cycle counter value ranges, where each erase cycle counter value range corresponds to a particular initial programming voltage.

25. The memory device of claim 24, wherein the initial programming voltage is determined responsive to a comparison of a particular erase cycle counter value and the plurality of erase cycle counter value ranges comprising the table.

* * * * *

UNITED STATES PATENT AND TRADEMARK OFFICE
CERTIFICATE OF CORRECTION

PATENT NO. : 8,358,538 B2  
APPLICATION NO. : 13/268158  
DATED : January 22, 2013  
INVENTOR(S) : Violante Moschiano et al.

Page 1 of 1

It is certified that error appears in the above-identified patent and that said Letters Patent is hereby corrected as shown below:

In column 1, line 7, delete "12/410,69," and insert -- 12/410,696, --, therefor.

In column 16, line 50, in claim 13, after "to" delete "the".

Signed and Sealed this  
Ninth Day of April, 2013

Teresa Stanek Rea  
*Acting Director of the United States Patent and Trademark Office*